(12) United States Patent
Cheng et al.

(10) Patent No.: US 9,391,069 B1
(45) Date of Patent: Jul. 12, 2016

(54) MIM CAPACITOR WITH ENHANCED CAPACITANCE FORMED BY SELECTIVE EPITAXY

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US); Raghavasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/957,843

(22) Filed: Dec. 3, 2015

(51) Int. Cl.
*H01L 27/06* (2006.01)
*H01L 49/02* (2006.01)
*H01L 29/04* (2006.01)
*H01L 29/06* (2006.01)
*H01L 21/02* (2006.01)
*H01L 21/033* (2006.01)
*H01L 29/423* (2006.01)

(52) U.S. Cl.
CPC ........ *H01L 27/0629* (2013.01); *H01L 21/0217* (2013.01); *H01L 21/02532* (2013.01); *H01L 21/0332* (2013.01); *H01L 28/82* (2013.01); *H01L 29/045* (2013.01); *H01L 29/0657* (2013.01); *H01L 29/42364* (2013.01)

(58) Field of Classification Search
CPC ...................... H01L 27/0629; H01L 21/02532; H01L 28/82; H01L 29/045; H01L 29/0657; H01L 29/42364; H01L 21/0332; H01L 21/0217

See application file for complete search history.

(56) References Cited

U.S. PATENT DOCUMENTS

| | | | |
|---|---|---|---|
| 5,043,780 A | 8/1991 | Fazan et al. | |
| 5,304,828 A | 4/1994 | Kim et al. | |
| 5,512,768 A | 4/1996 | Lur et al. | |
| 6,399,982 B1 | 6/2002 | Derderian et al. | |
| 6,709,947 B1 * | 3/2004 | Wrschka | H01L 28/84 257/E21.013 |
| 6,753,618 B2 | 6/2004 | Basceri et al. | |
| 6,784,473 B2 * | 8/2004 | Sakai | H01L 21/28291 257/295 |
| 6,806,138 B1 | 10/2004 | Cheng et al. | |
| 6,881,642 B2 | 4/2005 | Basceri et al. | |
| 6,911,373 B2 * | 6/2005 | Kellar | B82Y 10/00 257/E21.013 |
| 7,244,999 B2 * | 7/2007 | Aihara | H01G 4/008 257/306 |
| 7,298,019 B2 * | 11/2007 | Lee | H01L 28/82 257/532 |

(Continued)

FOREIGN PATENT DOCUMENTS

JP  5-343614 A  12/1993
JP  9-69605 A  3/1997

*Primary Examiner* — William Coleman
(74) *Attorney, Agent, or Firm* — Scully, Scott, Murphy & Presser, P.C.; Daniel P. Morris, Esq.

(57) ABSTRACT

An on-chip capacitor with enhanced capacitance and a method of forming the same are provided. An epitaxial process is employed to selectively form semiconductor material nodules on portions of a semiconductor material nodule nucleation layer that is present atop a semiconductor substrate. The semiconductor material nodules have an increased surface area for forming a capacitor structure thereon. A metal-insulator-metal capacitor structure is then formed surrounding each semiconductor material nodule. The resultant semiconductor structure (i.e., on-chip capacitor) has enhanced capacitance without increasing the size of the chip or the fabrication cost.

20 Claims, 3 Drawing Sheets

(56) References Cited

U.S. PATENT DOCUMENTS

| | | | |
|---|---|---|---|
| 7,911,029 B2 * | 3/2011 | Cui | H01G 4/206 257/532 |
| 8,124,492 B2 * | 2/2012 | Matsumoto | H01L 21/3145 257/E21.008 |
| 8,697,516 B2 * | 4/2014 | Furukawa | H01G 4/10 257/532 |
| 2014/0203400 A1 | 7/2014 | Kobrinsky et al. | |

\* cited by examiner

MIM CAPACITOR WITH ENHANCED CAPACITANCE FORMED BY SELECTIVE EPITAXY

BACKGROUND

The present application relates to semiconductor technology, and more particularly to a semiconductor structure containing a metal-insulator-metal (MIM) capacitor structure that has enhanced capacitance, and a method of forming the same.

On-chip capacitors including metal-insulator-metal (MIM) capacitors are essential for many semiconductor chips. To ensure a minimal capacitance, a large chip area is usually used for the capacitor which, in turn, adversely increases the chip size and thus the cost of the chip. There is thus a need for providing on-chip capacitors that have enhanced capacitance without increasing the size of the chip or the cost of the chip.

SUMMARY

An on-chip capacitor with enhanced capacitance and a method of forming the same are disclosed. In the present application, an epitaxial process is employed to selectively form semiconductor material nodules on portions of a semiconductor material nodule nucleation layer that is present atop a semiconductor substrate. The semiconductor material nodules have an increased surface area for forming a capacitor structure thereon. A metal-insulator-metal capacitor structure is then formed surrounding each semiconductor material nodule. The resultant semiconductor structure (i.e., on-chip capacitor) has enhanced capacitance without increasing the size of the chip or the fabrication cost.

In one aspect of the present application, a semiconductor structure is provided. In one embodiment of the present application, the semiconductor structure includes a semiconductor material nodule nucleation layer portion located on a topmost surface of a portion of a semiconductor substrate. At least one semiconductor material nodule is located on a topmost surface of a portion of the semiconductor material nodule nucleation layer portion. A metal-insulator-metal (MIM) capacitor structure surrounds the at least one semiconductor material nodule and is located on exposed portions of the topmost surface of the semiconductor material nodule nucleation layer portion.

In another aspect of the present application, a method of forming a semiconductor structure is provided. In one embodiment of the present application, the method may include forming a semiconductor material nodule nucleation layer on a topmost surface of a semiconductor substrate. An oxide hard mask portion is then formed on a portion of the semiconductor material nodule nucleation layer, while leaving another portion of the semiconductor material nodule nucleation layer exposed. Next, at least one semiconductor material nodule is formed on the another portion of the semiconductor material nodule nucleation layer. A metal-insulator-metal (MIM) capacitor structure is then formed surrounding the at least one semiconductor material nodule.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
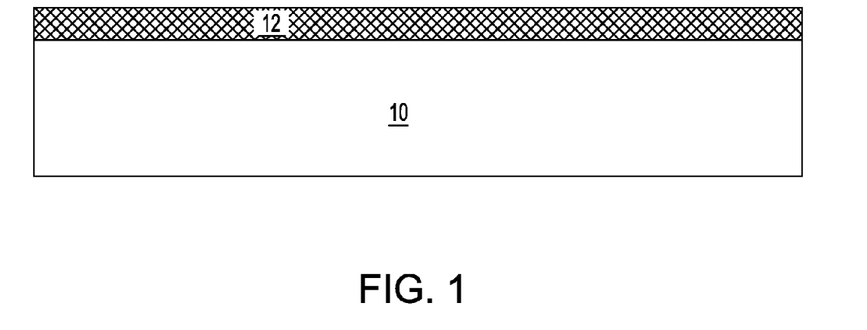
FIG. 1 is a cross sectional view of an exemplary semiconductor structure including from, bottom to top, a semiconductor substrate and a semiconductor material nodule nucleation layer.

Referring now to FIG. 1, there is illustrated an exemplary semiconductor structure including from, bottom to top, a semiconductor substrate 10 and a semiconductor material nodule nucleation layer 12. In the illustrated embodiment, the semiconductor material nodule nucleation layer 12 is a contiguous layer (without any breaks or interruptions) that covers the entirety of a topmost surface of the semiconductor substrate 10. In other embodiments of the present application (not shown), the semiconductor material nodule nucleation layer 12 may be formed within a region or regions of the semiconductor substrate 10 in which a capacitor structure(s) is(are) to be formed. In such an embodiment, other regions of the semiconductor substrate 10 may be processed to include one or more semiconductor devices other than a capacitor prior to formation of the semiconductor material nodule nucleation layer 12. The one or more semiconductor devices other than a capacitor may include, for example, a field effect transistor.

In one embodiment of the present application, the semiconductor substrate 10 that can be employed in the present application may be a bulk semiconductor substrate. By "bulk semiconductor substrate" it is meant that the entire substrate is composed of at least one semiconductor material. Exemplary semiconductor materials that can provide at least a portion of the bulk semiconductor substrate include, for example, Si, Ge, SiGe, SiC, SiGeC, III-V compound semiconductors or II-VI compound semiconductors. Typically, the semiconductor material that provides the bulk semiconductor substrate that can be employed as semiconductor substrate 10 is a single crystalline semiconductor material. In one example, the semiconductor substrate 10 is single crystalline silicon.

In some embodiments of the present application (not shown), the semiconductor substrate 10 may include a semiconductor-on-insulator (SOI) substrate. The SOI substrate includes, from bottom to top, a handle substrate, an insulator layer and a topmost semiconductor layer. In such an embodiment, the semiconductor material nodule nucleation layer 12 can be formed on the topmost semiconductor layer of the SOI substrate. The handle substrate provides mechanical support for the insulator layer and the topmost semiconductor layer.

The handle substrate and the topmost semiconductor layer of the SOI substrate may comprise the same, or different, semiconductor material. The semiconductor material of the handle substrate and the topmost semiconductor layer may include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a topmost semiconductor layer can be used as semiconductor substrate 10.

In some embodiments, the handle substrate and the topmost semiconductor layer may have the same or different crystal orientation. For example, the crystal orientation of the handle substrate and/or the topmost semiconductor layer may be {100}, {110}, or {111}. Other crystallographic orientations besides those specifically mentioned can also be used in the present application. The handle substrate and/or the topmost semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. In some embodiments, the insulator layer is continuously presented between the topmost semiconductor layer and the handle substrate.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the topmost semiconductor layer to a layer having a thickness that is more desirable.

In some embodiments of the present application, the semiconductor substrate 10 is entirely or at least partially doped with an n-type or p-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In some embodiments of the present application (not shown), the semiconductor substrate 10 may be processed to include at least one isolation structure such as, for example, a trench isolation structure or a field oxide isolation structure. Trench isolation structures can be formed utilizing a trench isolation process that may include forming a trench within the semiconductor substrate 10 by lithography and etching. Thereafter, the trench can be filled with a trench dielectric material such as, for example, silicon dioxide. A planarization process and/or a densification process may follow the filling of the trench with the trench dielectric material. Field oxide isolation structures can be formed utilizing a local oxidation of silicon process as is well known to those skilled in the art.

The semiconductor material nodule nucleation layer 12 is then provided atop the semiconductor substrate 10. The term "semiconductor material nodule nucleation layer" denotes any material that can promote the subsequent non-selective amorphous nodule formation during the epitaxial growth of a semiconductor material. The semiconductor material nodule nucleation layer 12 may also be referred to as a nucleation layer which promotes semiconductor material nodule formation. In one embodiment of the present application, the material that can provide the semiconductor material nodule nucleation layer 12 is a nitride such as, for example, silicon nitride.

The semiconductor material nodule nucleation layer 12 can be formed utilizing a deposition process such as, for example, chemical vapor deposition or plasma enhanced chemical vapor deposition. The semiconductor material nodule nucleation layer 12 can have a thickness from 20 nm to 100 nm. Other thicknesses that are lesser than, or greater than, the aforementioned thickness range can also be employed as the thickness of the semiconductor material nodule nucleation layer 12.

Figure 2:
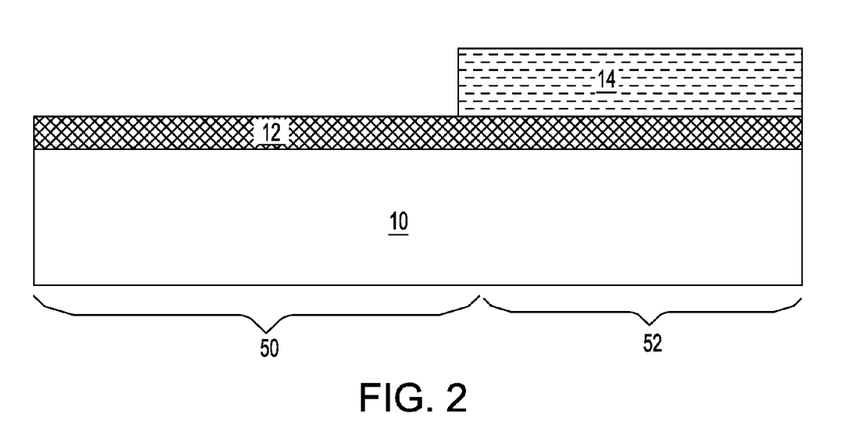
FIG. 2 is a cross sectional view of the exemplary semiconductor structure of FIG. 1 after forming an oxide hard mask portion on a portion of the semiconductor material nodule nucleation layer to protect a second device region of the exemplary semiconductor structure.

Referring now to FIG. 2, there is illustrated the exemplary semiconductor structure of FIG. 1 after forming an oxide hard mask portion 14 on a portion of the semiconductor material nodule nucleation layer 12 to protect a second device region 52 of the exemplary semiconductor structure. The oxide hard mask portion 14 comprises a different composition than the semiconductor material nodule nucleation layer 12. The second device region 52 is a region of the semiconductor substrate 10 in which one or more semiconductor devices other than a capacitor can be formed. As mentioned above, the one or more semiconductor devices other than a capacitor may include, for example, a field effect transistor.

As is shown, the oxide hard mask portion 14 is absent from a first device region 50 of the semiconductor substrate. The first device region 50 is a region of the semiconductor substrate 10 in which one or more capacitor structures will be subsequently formed therein. The first device region 50 lies adjacent to the second device region 52. In some embodiments (not shown), an isolation structure may be formed within the semiconductor substrate 10 to provide a clear distinction between the first and second device regions (50, 52). In other embodiments and as shown, there is no isolation structure that is present that provides a clear distinction between the first and second device regions (50, 52).

The oxide hard mask portion 14 may comprise any oxide-containing hard mask material. In one example, the oxide hard mask portion 14 may comprise silicon dioxide. The oxide-containing hard mask material that provides the oxide hard mask portion 14 can be formed utilizing a conventional deposition process such as, for example, chemical vapor deposition or plasma enhanced chemical vapor deposition. The oxide-containing hard mask material that provides the hard mask layer can have a thickness from 20 nm to 100 nm. Other thicknesses that are lesser than, or greater than, the aforementioned thickness range can also be employed as the thickness of the oxide-containing hard mask material that provides the oxide hard mask portion 14.

After providing the oxide-containing hard mask material, the oxide-containing hard mask material is then patterned to provide the oxide hard mask portion 14. The patterning of the oxide-containing hard mask material may be performed by lithography and etching. Lithography includes forming a photoresist material (not shown) atop a material or material stack to be patterned; in the present application the photoresist material is formed atop the oxide-containing hard mask material. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the oxide-containing hard mask material. The pattern provided by the patterned photoresist structure is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. Notwithstanding the type of etch employed, the etch stop on a topmost surface of the semiconductor material nodule nucleation layer 12. The patterned resist material may be removed at this point of the present application by utilizing a resist removal process such as, for example, ashing.

Figure 3:
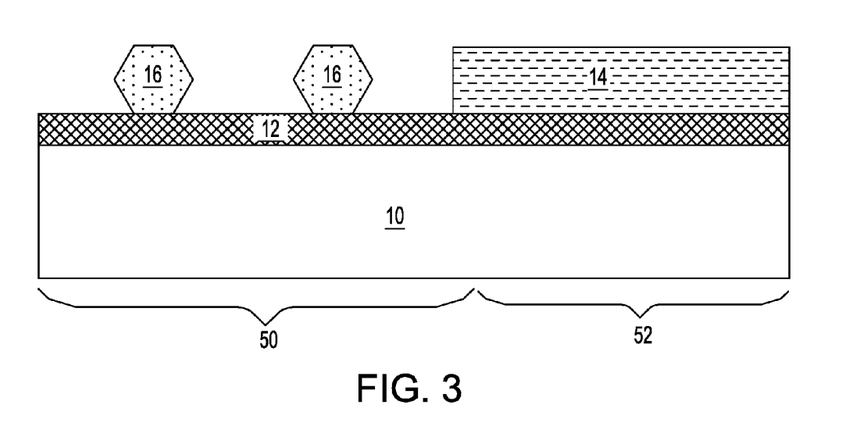
FIG. 3 is a cross sectional view of the exemplary semiconductor structure of FIG. 2 after forming semiconductor material nodules on exposed portions of the semiconductor material nodule nucleation layer and within a first device region of the exemplary semiconductor structure.

Referring now to FIG. 3, there is illustrated the exemplary semiconductor structure of FIG. 2 after forming semiconductor material nodules 16 on exposed portions of the semiconductor material nodule nucleation layer 12 and within a first device region 50 of the exemplary semiconductor structure. As is shown, a bottommost surface of each semiconductor material nodule 16 directly contacts a portion of a topmost surface of the semiconductor material nodule nucleation layer 12. Although the present application illustrates the formation of two semiconductor material nodules 16, the present application also works in forming a single semiconductor material nodule or more than two semiconductor material nodules.

By "semiconductor material nodule" it is meant a regular or irregular shaped solid mass of semiconductor atoms, i.e., Si atoms, that has a discrete and defined boundary. The semiconductor material nodules 16 that are formed typically have a width from 5 nm to 100 nm, and a height from 5 nm to 100 nm. Each semiconductor material nodule 16 that is formed is separated from its nearest neighboring semiconductor material nodule 16 by a gap. Thus, the semiconductor material nodules 16 that are formed are not in direct physical contact with one another.

The shape (i.e., geometrical shape) of the semiconductor material nodules 16 may vary depending on the conditions that are employed in forming the same. Exemplary shapes of the semiconductor material nodules 16 include, elliptical, polygonal (having 5, 6, 7, 8, etc. sides), triangular, square, rectangular, or diamond. In one embodiment, and as depicted, the semiconductor material nodules are six sided, i.e., they have a hexagonal shape.

The semiconductor material nodules 16 include one of the semiconductor materials mentioned above for the bulk semiconductor substrate. In one embodiment, the semiconductor material nodules 16 comprise silicon. In some embodiments, the semiconductor material nodules 16 are non-doped. In yet another other embodiments, the semiconductor material nodules 16 may be doped with either a p-type or n-type dopant as mentioned above.

The semiconductor material nodules 16 may be formed utilizing an epitaxial growth (or deposition) process which selectively forms said at least one semiconductor material nodule 16 on a portion the semiconductor material nodule nucleation layer 12, and not the oxide hard mask portion 14. The epitaxial growth process that is employed is performed from 10% to 15% outside a selective epitaxial growth process regime. That is, the concentration of etchant gas, such as, for example, HCl, used during the selective epitaxial growth process is less (10% to 15%) than that normally used during a normal selective epitaxial growth.

Examples of various epitaxial growth process apparatuses that are suitable for use in forming the semiconductor material nodules 16 include, e.g., rapid thermal chemical vapor deposition (RTCVD), low-energy plasma deposition (LEPD), ultra-high vacuum chemical vapor deposition (UH-VCVD), atmospheric pressure chemical vapor deposition (APCVD) and molecular beam epitaxy (MBE). The temperature for epitaxial deposition typically ranges from 550° C. to 900° C.

A number of different sources may be used for the deposition of the semiconductor material nodules 16. In some embodiments, the source gas for the deposition of the semiconductor material nodules 16 includes a silicon containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. In another embodiment, the source gas for the deposition of semiconductor material nodules 16 may include a germanium containing source gas. Examples of germanium containing source gases include germane, digermane, halogermane, dichorogermane, trichlorogermane, tetrachlorogermane and combinations thereof. In some embodiments, a silicon containing gas source and a germanium containing gas source can be used in conjunction to provide the semiconductor material nodules 16. Carrier gases like hydrogen, nitrogen, helium and argon can be used. A n-type dopant or a p-type dopant can be added into the reactant gas mixture that provides the semiconductor material nodules 16.

Figure 4:
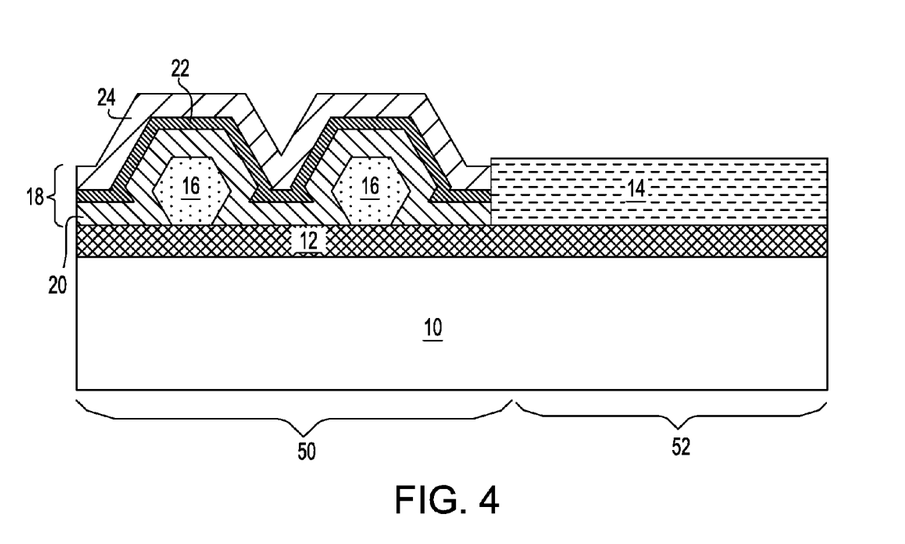
FIG. 4 is a cross sectional view of the exemplary semiconductor structure of FIG. 3 after forming a metal-insulator-metal (MIM) capacitor structure in the first device region and on exposed surfaces of the semiconductor material nodules and remaining exposed portions of the semiconductor material nodule nucleation layer.

Referring now to FIG. 4, there is illustrated the exemplary semiconductor structure of FIG. 3 after forming a metal-insulator-metal (MIM) capacitor structure 18 in the first device region 50 and on exposed surfaces of the semiconductor material nodules 16 and remaining exposed portions of the semiconductor material nodule nucleation layer 12. As is shown, the MIM capacitor structure 18 surrounds the exposed sidewalls and topmost surface of each semiconductor material nodule 16.

The MIM capacitor structure includes a material stack of, from bottom to top, a first metal layer 20, a dielectric (insulator) layer 22, and a second metal layer 24. The first metal layer 20 may be referred as a bottom electrode, and the second metal layer 24 may be referred to as a top electrode. The first and second metal layers (20, 24) comprise a conductive metal and/or metal nitride. In some embodiments, the first metal layer 20 may comprise a same conductive metal and/or metal nitride as the second metal layer 24. In yet other embodiments, the first metal layer 20 may comprise a different conductive metal and/or metal nitride than the second metal layer 24. Exemplary materials that may be used for the first and second metal layers (20, 24) may include titanium (Ti), titanium nitride (TiN), tantalum (Ta), tantalum nitride (TaN), or copper (Cu).

The first and second metal layers (20, 24) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the first and second metal layers (20, 24) may each have a thickness from 1 nm to 25 nm. Other thicknesses that are lesser than, or greater than, the aforementioned thickness range can also be employed as the thickness of the first and second metal layers (20, 24).

The dielectric layer 22 that is sandwiched between the first and second metal layers (20, 24) can be a dielectric oxide, dielectric nitride, and/or dielectric oxynitride. In one embodiment, the dielectric layer 22 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The dielectric layer 22 may also comprises silicon dioxide and/or silicon nitride.

Dielectric layer 22 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the dielectric layer 22 can have a thickness in a range from 1 nm to 10 nm. Other thicknesses that are lesser than, or greater than, the aforementioned thickness range can also be employed for the dielectric layer 22.

As is shown in FIG. 4, the first metal layer 20, the dielectric layer 22 and the second metal layer 24 have sidewall surfaces, i.e., edges that are vertically aligned with each other. As is also shown, a bottommost surface of the first metal layer 20 directly contacts exposed surfaces of each semiconductor material nodule 16. Due to the presence of the semiconductor material nodules 16, the resultant capacitor structure 18 that is formed has an enhanced capacitance as compared to prior art MIM capacitors that are formed entirely on planar surfaces.

Figure 5A:
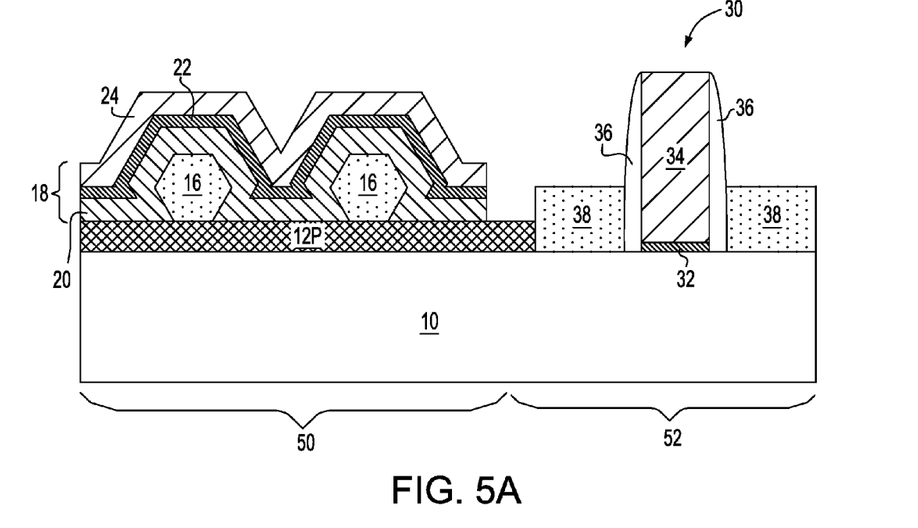
FIG. 5A is a cross sectional view of the exemplary semiconductor structure of FIG. 4 after removing the oxide hard mask portion and the underlying semiconductor material nodule nucleation layer from the second device region, and forming a functional gate structure utilizing a gate first process on an exposed surface of the semiconductor substrate in accordance with an embodiment of the present application.
Figure 5B:
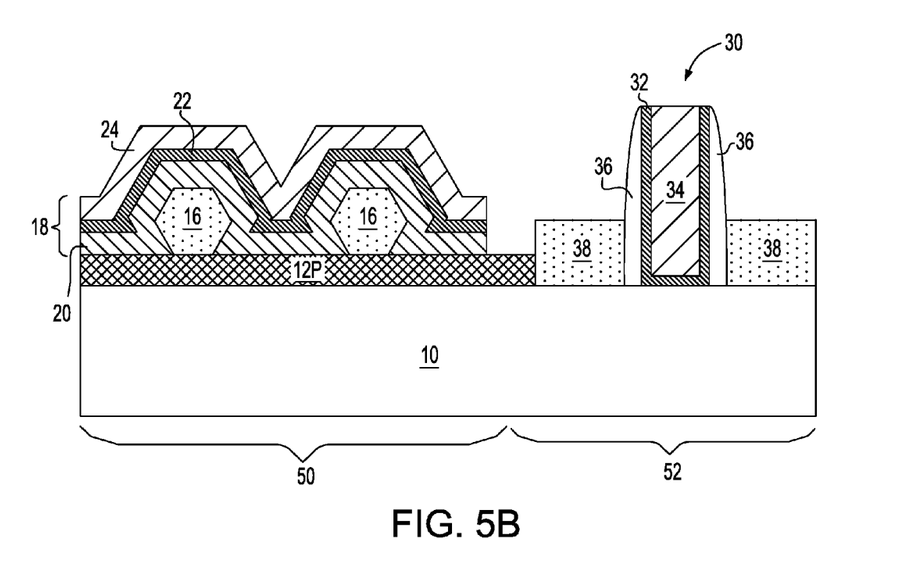
FIG. 5B is a cross sectional view of the exemplary semiconductor structure of FIG. 4 after removing the oxide hard mask portion and the underlying semiconductor material nodule nucleation layer from the second device region, and forming a functional gate structure utilizing a replacement metal gate process on an exposed surface of the semiconductor substrate in accordance with an embodiment of the present application.

Referring now to FIG. 5A, there is illustrated the exemplary semiconductor structure of FIG. 4 after removing the oxide hard mask portion 14 and the underlying semiconductor material nodule nucleation layer 12 from the second device region 52, and forming a functional gate structure 30 utilizing a gate first process on an exposed surface of the semiconductor substrate 10 in accordance with an embodiment of the present application. FIG. 5B illustrates the exemplary semiconductor structure of FIG. 4 after removing the oxide hard mask portion 14 and the underlying semiconductor material nodule nucleation layer 12 from the second device region 52, and forming a functional gate structure 30 utilizing a replacement metal gate process on an exposed surface of the semiconductor substrate 10 in accordance with an embodiment of the present application.

Although the present application describes and illustrates the formation of the functional gate structure 30 after forming the semiconductor material nodules 16, the functional gate structure 30 (and/or sacrificial gate structure) can be formed prior to semiconductor material nodule 16 formation. In such an instance, the functional gate structure 30 (and/or sacrificial gate structure) can be formed prior to formation of the semiconductor material nodule nucleation layer 12. A block mask (such as an oxide hard mask) may then be formed over the functional gate structure 30 (and/or sacrificial gate structure) and the processing as shown in FIGS. 1 and 3-4 is then performed. In such an embodiment, the block mask takes the place of the oxide hard mask portion 14 shown in FIG. 2.

In the illustrated embodiment, a block mask (not shown) can be formed over the first device region 50 including MIM capacitor structure 18. Next, the oxide hard mask portion 14 is removed utilizing a first etching process that is selective in removing the oxide-containing hard mask material that provides the oxide hard mask portion 14. A second etch is then used to remove the portion of the semiconductor material nodule nucleation layer 12 within the second device region 52. A portion of the semiconductor material nodule nucleation layer 12 remains in the first device region 50. The remaining portion of the semiconductor nodule nucleation layer 12 can now be referred to as a semiconductor material nodule nucleation layer portion 12P. The second etch exposes a topmost surface of the semiconductor substrate 10 within the second device region 52. The functional gate structure 30 can now be formed.

By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures 30 can be formed.

Each functional gate structure 30 includes a gate material stack of, from bottom to top, a gate dielectric portion 32 and a gate conductor portion 34. In some embodiments (not shown), a gate cap portion can be present atop at least the gate conductor portion 34. FIG. 5A shows an embodiment in which the gate dielectric portion 32 is located entirely beneath a bottommost surface of the gate conductor portion 34. FIG. 5B shows another embodiment in which the gate dielectric portion 32 is U-shaped and the gate conductor portion 34 is located between the vertical wall portions of the U-shaped gate dielectric portion. In such an embodiment, the gate dielectric portion 32 can have a topmost surface that is coplanar with a topmost surface of the gate conductor portion 34.

The gate dielectric portion 32 of the functional gate structure 30 comprises a gate dielectric material. The gate dielectric material that provides the gate dielectric portion 32 can be an oxide, nitride, and/or oxynitride. In one example, the gate dielectric material that provides the gate dielectric portion 32 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 32. In some embodiments, the gate dielectric portion 32 of each functional gate structure comprises a same gate dielectric material. In other embodiments, a first set of functional gate structures comprises a first gate dielectric material while a second set of functional gate structures comprises a second gate dielectric material that differs from the first gate dielectric material.

The gate dielectric material used in providing the gate dielectric portion 32 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 32 can have a thickness in a range from 1 nm to 10 nm. Other thicknesses that are lesser than, or greater than, the aforementioned thickness range can also be employed for the gate dielectric material.

The gate conductor portion 34 of the functional gate structure comprises a gate conductor material. The gate conductor material used in providing the gate conductor portion 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 34 of each functional gate structure comprises a same conductive material. In other embodiments, the gate conductor portion of a first functional gate structure comprises a different gate conductor material than a gate conductor portion of a second set of functional gate structures. For example, the gate conductor portion of a first set of functional gate structure may comprise an nFET gate metal, while the gate conductor portion of a second set of functional gate structure may comprise a pFET gate metal.

The gate conductor material used in providing the gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 34 has a thickness from 1 nm to 100 nm. Other thicknesses that are lesser than, or greater than, the aforementioned thickness range can also be employed for the gate conductor material used in providing the gate conductor portion 34.

If present, the gate cap portion of the functional gate structure comprises a gate cap material. The gate cap material that provides the gate cap portion may include a hard mask material such as, for example, silicon dioxide, silicon nitride, and/or silicon oxynitride. The hard mask material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped; see for example, FIG. 5B. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), dielectric spacers 36 can be formed on exposed sidewall surfaces of the respective gate structure. The dielectric spacers 36 may comprise a spacer dielectric material such as, for example, silicon dioxide and/or silicon nitride. The dielectric spacers 36 can be formed by depositing a spacer material and thereafter a spacer etch can be performed. Next, a source region (not shown) is formed on one side of each gate structure and a drain region (not shown) is formed on another side of each gate structure. The source region and the drain region would be present within the semiconductor substrate 10 and would be located at the footprint of the gate structure. In some embodiments and as shown, a raised source/drain region 38 may formed atop the source/drain regions. The raised source/drain regions 38 comprise one of the semiconductor materials mentioned above for the bulk semiconductor substrate. A p-type or n-type dopant can be present in the raised source/drain regions 38. The raised source/drain regions 28 can be formed utilizing an epitaxial growth process as is well known in the art.

As is depicted in FIGS. 5A and 5B, a bottommost surface of the functional gate structure 30 is coplanar with a bottommost surface of the semiconductor material nodule nucleation layer portion 12P.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a semiconductor material nodule nucleation layer portion located on a topmost surface of a portion of a semiconductor substrate;
    at least one semiconductor material nodule located on a topmost surface of a portion of said semiconductor material nodule nucleation layer portion; and
    a metal-insulator-metal (MIM) capacitor structure surrounding said at least one semiconductor material nodule and located on exposed portions of said topmost surface of said semiconductor material nodule nucleation layer portion.

2. The semiconductor structure of claim 1, wherein at least one field effect transistor is located on another portion of said semiconductor substrate which is adjacent said portion of said semiconductor structure containing said metal-insulator-metal capacitor structure.

3. The semiconductor structure of claim 1, wherein said at least one field effect transistor comprises a gate dielectric portion and a gate conductor portion, wherein said gate dielectric portion is located entirely beneath a bottommost surface of said gate conductor portion.

4. The semiconductor structure of claim 1, wherein said at least one field effect transistor comprises a gate dielectric portion and a gate conductor portion, wherein said gate dielectric portion is U-shaped and has topmost surfaces that are coplanar with a topmost surface of said gate conductor portion.

5. The semiconductor structure of claim 1, wherein said at least one semiconductor material nodule comprises silicon.

6. The semiconductor structure of claim 1, wherein said at least one semiconductor material nodule has a hexagonal shape.

7. The semiconductor structure of claim 1, wherein said MIM capacitor structure comprises, from bottom to top, a first metal layer, a dielectric layer, and a second dielectric layer.

8. The semiconductor structure of claim 1, wherein said at least one semiconductor material nodule has a width from 5 nm to 100 nm, and a height from 5 nm to 100 nm.

9. The semiconductor structure of claim 1, wherein said semiconductor material nodule nucleation layer portion comprises silicon nitride.

10. The semiconductor structure of claim 2, wherein a bottommost surface of said at least one field effect transistor is coplanar with a bottommost surface of said semiconductor material nodule nucleation layer portion.

11. A method of forming a semiconductor structure, said method comprising:
    forming a semiconductor material nodule nucleation layer on a topmost surface of a semiconductor substrate;
    forming an oxide hard mask portion on a portion of said semiconductor material nodule nucleation layer, while leaving another portion of said semiconductor material nodule nucleation layer exposed;
    forming at least one semiconductor material nodule on said another portion of said semiconductor material nodule nucleation layer; and
    forming a metal-insulator-metal (MIM) capacitor structure surrounding said at least one semiconductor material nodule.

12. The method of claim 11, wherein forming said semiconductor material nodule nucleation layer comprises depositing a silicon nitride layer.

13. The method of claim 11, wherein said forming said oxide hard mask portion comprises depositing an oxide hard mask layer and patterning said oxide hard mask layer.

14. The method of claim 11, wherein said forming said at least one semiconductor material nodule comprises an epitaxial growth process which selectively forms said at least one semiconductor material nodule on said another portion of said semiconductor material nodule nucleation layer, and not said oxide hard mask portion.

15. The method of claim 11, wherein said forming said metal-insulator-metal (MIM) capacitor structure comprises:
    forming a first metal layer,
    forming a dielectric layer on said first metal layer; and
    forming a second dielectric layer on said dielectric layer.

16. The method of claim 11, wherein said at least one semiconductor material nodule comprises silicon.

17. The method of claim 11, wherein said at least one semiconductor material nodule has a width from 5 nm to 100 nm, and a height from 5 nm to 100 nm.

18. The method of claim 11, wherein said at least one semiconductor material nodule has a hexagonal shape.

19. The method of claim 11, further comprising forming at least one field effect transistor on a portion of said topmost surface of said semiconductor structure, wherein said at least one field effect transistor can be formed prior to said forming said semiconductor material nodule nucleation layer or after said forming said MIM capacitor structure.

20. The method of claim 14, wherein said epitaxial growth process is performed from 10% to 15% outside a selective epitaxial growth process regime.

* * * * *